United States Patent
Lee et al.

(10) Patent No.: US 11,189,670 B2
(45) Date of Patent: Nov. 30, 2021

(54) DISPLAY APPARATUS HAVING ZERO BEZEL BY BENDING BEZEL AREA

(71) Applicant: LG Display Co., Ltd., Seoul (KR)

(72) Inventors: Moonsun Lee, Incheon (KR); Eunah Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/055,706

(22) Filed: Aug. 6, 2018

(65) Prior Publication Data

US 2019/0131362 A1  May 2, 2019

(30) Foreign Application Priority Data

Oct. 31, 2017 (KR) .......................... 10-2017-0143918

(51) Int. Cl.
*H01L 27/32* (2006.01)
*H01L 33/44* (2010.01)
*G09G 3/20* (2006.01)

(52) U.S. Cl.
CPC ........... *H01L 27/3244* (2013.01); *G09G 3/20* (2013.01); *H01L 27/3213* (2013.01); *H01L 33/44* (2013.01); *G09G 2300/0426* (2013.01); *G09G 2380/02* (2013.01)

(58) Field of Classification Search
CPC .................. G09G 2380/00; H01L 51/0097
See application file for complete search history.

(56) References Cited

U.S. PATENT DOCUMENTS

| | | | |
|---|---|---|---|
| 2016/0093683 A1 | 3/2016 | Lee et al. | |
| 2017/0338429 A1* | 11/2017 | Watabe | ............... H01L 51/5271 |
| 2018/0032189 A1* | 2/2018 | Lee | ...................... G09G 3/3225 |
| 2018/0151835 A1* | 5/2018 | Kim | .................... H01L 51/0097 |

FOREIGN PATENT DOCUMENTS

| | | |
|---|---|---|
| CN | 1971357 A | 5/2007 |
| CN | 104103669 A | 10/2014 |
| CN | 104425773 A | 3/2015 |
| CN | 104659062 A | 5/2015 |
| CN | 105226079 A | 1/2016 |
| CN | 106784377 A | 5/2017 |
| CN | 106796947 A | 5/2017 |
| CN | 107132687 A | 9/2017 |
| KR | 10-2013-0076402 A | 7/2013 |
| KR | 2015-0137186 A | 12/2015 |
| KR | 2016-0066316 A | 6/2016 |
| KR | 10-2017-0106590 A | 9/2017 |

OTHER PUBLICATIONS

Office Action dated Jul. 2, 2021 issued in corresponding Chinese Patent Application No. 201811178547.5 w/English Translation (19 pages).

* cited by examiner

*Primary Examiner* — Suberr L Chi
(74) *Attorney, Agent, or Firm* — Polsinelli PC

(57) ABSTRACT

Currently described is a display that has a base layer, and on top of that base layer is a buffer layer with two exposed portions. The exposed portions are covered with a film. A pixel layer is placed between the two films, and a first substrate is attached to the pixel layer using an adhesive layer. The substrate is designed using either multiple thicknesses or grooves to facilitate a curvature radius of the end portions of the display to achieve a zero bezel display.

18 Claims, 5 Drawing Sheets

DISPLAY APPARATUS HAVING ZERO BEZEL BY BENDING BEZEL AREA

CROSS REFERENCE TO RELATED APPLICATION

This application claims the benefit of the Korean Patent Application No. 10-2017-0143918 filed on Oct. 31, 2017, which is hereby incorporated by reference for all purposes as if fully set forth herein.

FIELD OF THE DISCLOSURE

The present disclosure relates to a display apparatus.

BACKGROUND

With the advancement of the information age, a demand for a display device for displaying an image has been increased in various forms. Recently, a display device of a slimmer size has been launched. Particularly, a flexible display device has many advantages including that it is easy to carry and have various shaped devices.

Since the flexible display device includes a bending area that may fold a substrate and may reduce a bezel size by folding the substrate at the bending area, the flexible display device may be realized as a display device having a narrow bezel.

However, as a bending level is increased to have a narrower bezel, the stress on the edges of the panel is increased and a stress inside a panel becomes strong, causing problems to occur, for example, a light emitting diode layer is laminated and a thin film transistor is shorted.

SUMMARY

Accordingly, the present disclosure is directed to a display apparatus that substantially obviates one or more problems due to limitations and disadvantages of the related art.

An advantage of the present disclosure is to provide a display apparatus that may have a zero bezel by facilitating bending.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided a display apparatus comprising a first substrate having a display area and a non-display area surrounding the display area; a pixel array layer provided on the display area of the first substrate; and a second substrate provided on the pixel array layer, having a first area and a second area bent from the first area, wherein the second substrate has thicknesses different in the first area and the second area.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
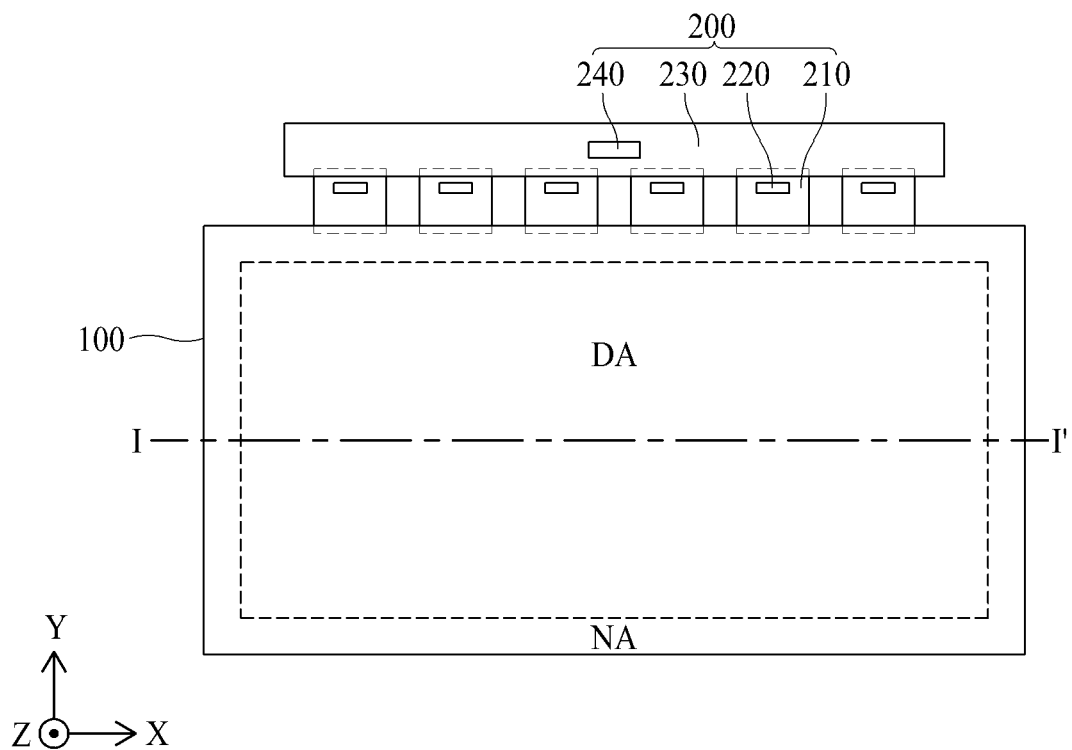
FIG. 1 is a plane view illustrating the state that a display apparatus according to one embodiment of the present disclosure is not bent.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely examples, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~%', 'above~', 'below~%', and 'next to~', one or more portions may be arranged between two other portions unless 'just' or 'direct' is used.

In describing a time relationship, for example, when the temporal order is described as 'after~', 'subsequent~', 'next~', and 'before~%', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the preferred embodiments of the present disclosure will be described in detail with reference to the accompanying drawings. Wherever possible, the same reference numbers will be used throughout the drawings to refer to the same or like parts.

Figure 2:
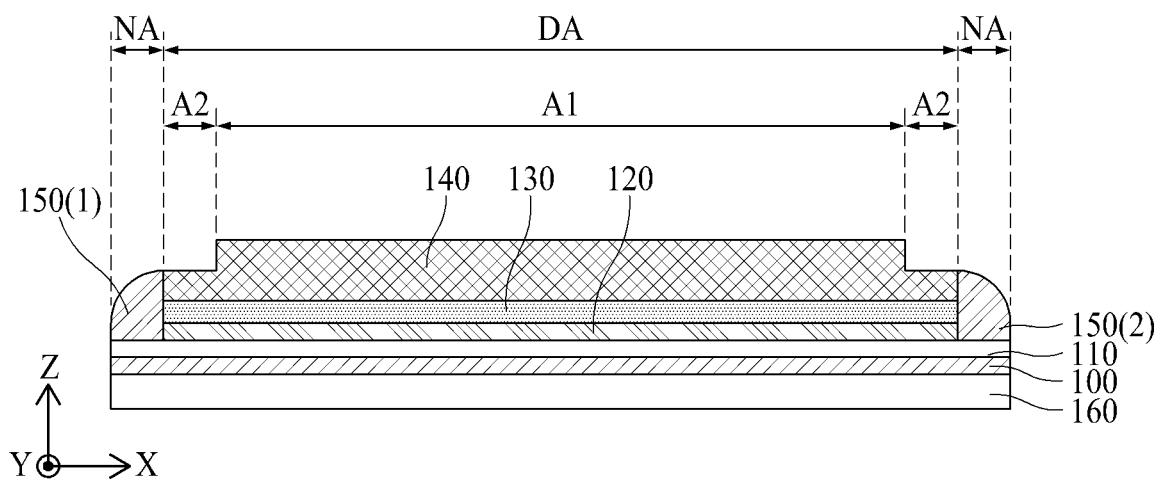
FIG. 2 is a cross-sectional view taken along line I-I' of FIG. 1, illustrating a display apparatus according to the first embodiment of the present disclosure.

FIG. 1 is a plane view illustrating the state that a display apparatus according to one embodiment of the present disclosure is not bent, and FIG. 2 is a cross-sectional view taken along line I-I' of FIG. 1, illustrating a display apparatus according to the first embodiment of the present disclosure.

Referring to FIGS. 1 and 2, the display apparatus according to the first embodiment of the present disclosure comprises a substrate 100, a pixel array layer 120, a second substrate 140, and first and second cover layers 150(1) and 150(2).

The first substrate 100 is a flexible substrate as a base substrate. For example, the first substrate 100 may include a transparent polyimide material. The first substrate 100 made of a polyimide material may be a hardened polyimide resin coated with a constant thickness on a front surface of a release layer provided on a carrier glass substrate. The carrier glass substrate is separated from the first substrate 100 by release of the release layer using a laser release process.

The substrate 100 includes a display area DA and a non-display area NA.

The display area DA is an area where an image is displayed, and may be defined at a center portion of the first substrate 100. This display area DA may be defined as an area where the pixel array layer 120 for displaying an image is arranged.

The non-display area NA is an area where an image is not displayed, and may be defined as an edge portion of the substrate 100 to surround the display area DA.

A buffer layer 110 may be formed on the first substrate 100. The buffer layer 110 is formed on an entire surface of the first substrate 100 to prevent water from being permeated into the display area DA through the first substrate 100. The buffer layer 110 according to one embodiment may be made of a plurality of inorganic films which are deposited alternately. For example, the buffer layer 110 may be formed of a multi-layered film of one or more inorganic films of a silicon oxide film (SiOx), a silicon nitride film (SiNx), SiON and $SiO_2$, which are deposited alternately. The buffer layer 110 may be omitted.

The pixel array layer 120 is arranged on the display area DA of the first substrate 100. That is, the pixel array layer 120 is provided on the buffer layer 110 overlapped with the display area DA defined in the first substrate 100.

The pixel array layer 120 may include scan lines, data lines, driving power lines, a pixel driving circuit, and a light emitting diode layer.

The scan lines may be arranged in parallel with a first direction X of the first substrate 100 and spaced apart from each other along a second direction Y of the first substrate 100.

The data lines may be arranged in parallel with the second direction Y of the first substrate 100 and spaced apart from each other along the first direction X of the first substrate 100.

The driving power lines are arranged in parallel with the data lines.

The pixel driving circuit is provided in a pixel area defined by crossing between the scan lines and the data lines and may include at least two thin film transistors and at least one capacitor. The pixel driving circuit emits the light emitting diode layer in accordance with a scan signal supplied from the scan line adjacent thereto, a driving power supplied from the driving power line adjacent thereto, and a data signal supplied from the data line.

The light emitting diode layer emits light in accordance with the data signal supplied from a pixel driving circuit of a corresponding pixel. The light emitted from the light emitting diode layer is emitted to the outside by passing through the first substrate 100. The light emitting diode layer may include a first electrode connected to the pixel driving circuit of the corresponding pixel, a light emitting layer formed on the first electrode, and a second electrode formed on the light emitting layer.

The first electrode may be an anode electrode individually patterned in the pixels. The first electrode is formed of a transparent metal material such as ITO and IZO, which may transmit light.

The light emitting layer according to one embodiment may include a red light emitting layer, a green light emitting layer and a blue light emitting layer, each of which emits light corresponding to a color set to the pixel.

The light emitting layer according to another embodiment may be a common layer commonly formed in the pixels. In this case, a manufacturing process may be simplified. The light emitting layer may include any one of an organic light emitting layer, an inorganic light emitting layer, and a quantum dot light emitting layer, or may include a deposited or mixed structure of an organic light emitting layer (or inorganic light emitting layer) and a quantum dot light emitting layer. The light emitting layer includes two or more light emitting portions for emitting white light. For example, the light emitting layer may include first and second light emitting portions for emitting white light by means of mixture of the first light and the second light. In this case, the first light emitting portion emits the first light, and may include any one of a blue light emitting portion, a green light emitting portion, a red light emitting portion, a yellow light emitting portion, a yellow-green light emitting portion. The second light emitting portion may include a light emitting portion for emitting light having a complementary color of the first light of the blue light emitting portion, the green light emitting portion, the red light emitting portion, the yellow light emitting portion, and the yellow-green light emitting portion.

The second electrode is a cathode electrode and may be a common layer commonly formed in the pixels. The second electrode may include a metal material having high reflectivity. For example, the second electrode may be formed of a multi-layered structure such as a deposition structure (Ti/Al/Ti) of Al and Ti, a deposition structure (ITO/Al/ITO) of Al and ITO, an APC alloy (Ag/Pd/Cu), and a deposition structure (ITO/APC/ITO) of APC alloy and ITO, or may include a single layered structure of any one material selected from Ag, Al, Mo, Au, Mg, Ca, and Ba, or an alloy material of two or more.

The second substrate 140 is arranged on the pixel array layer 120, and has a first surface adjacent to the pixel array layer 120 and a second surface opposite to the first surface. The first surface of the second substrate 140 is attached to the pixel array layer 120. The second substrate 140 serves to primarily block oxygen or water from being permeated into the light emitting diode layer. The second substrate 140 according to one embodiment may be a metal foil, a metal sheet, or a metal plate. For example, the second substrate 140 may be made of, but not limited to, an alloy material of Fe and Ni, which has a low thermal expansion coefficient.

The second substrate 140 includes a first area A1 and a second area A2 bent from the first area.

The first area A1 is a plane area, and may be defined as an area overlapped with a front display area of the first substrate 100.

The second area A2 is a bending area, and may be defined as an area overlapped with an edge display area of the first substrate 100. The second area A2 may be a portion which is bent in a curved type.

The second substrate 140 according to one embodiment may be formed to have a respective thickness in the first area A1 and the second area A2. For example, the second substrate 140 in the first area A1 may be formed to have a thickness thicker than that in the second area A2. The second substrate 140 may be formed through a partial etching process of the second area A2. For example, the second area A2 may partially be etched using processes including an etching process and a laser process.

Since the second substrate 140 is formed to have a respective thickness in the first area A1 and the second area A2, a step difference is formed in a boundary between the first area A1 and the second area A2. For example, the step difference may have a range of 40 μm to 60 μm.

The display apparatus according to the present disclosure may facilitate bending because the second substrate 140 is formed at different thicknesses. If a thickness of a bending area of the display apparatus is reduced, stress generated during bending is reduced, and homeostasis of the display panel may be maintained. In this way, if the first area A1 is formed to have a thickness thicker than that of the second area A2 in the second substrate 140, stress applied to the display panel may be reduced, and a wide choice of a curvature radius may be obtained, whereby a bezel size of the display panel may be reduced.

The first surface of the second substrate 140 is attached to the pixel array layer 120 by an adhesive layer 130. The adhesive layer 130 may be a thermal hardening adhesive or a natural hardening adhesive. For example, the adhesive layer 130 may be made of a material such as a decompression adhesive or a barrier decompression adhesive having a moisture absorption function.

The first and second cover layers 150(1) and 150(2) are provided on the non-display area NA of the first substrate 100 to adjoin the side of the second substrate 140. The first and second cover layers 150(1) and 150(2) may be made of urethane or acryl, which include a polymer material. The cover layer 150 according to one embodiment may be provided to be higher than the adhesive layer 130 in the non-display area NA adjacent to the display area DA of the firs substrate 100, thereby preventing water permeation through the adhesive layer 130.

The first and second cover layers 150(1) and 150(2) according to one embodiment is provided to prevent rolling of the first substrate 100 during a process of separating a carrier glass substrate from the first substrate 100 by release of a release layer using a laser release process. In detail, since the second substrate 140 is not provided in the non-display area NA of the first substrate 100, the first substrate 100 which is flexible and thin is rolled. The first and second cover layers 150(1) and 150(2) may be provided on the non-display area NA of the first substrate 100 to prevent rolling of the first substrate 100 from occurring, and then to facilitate a lamination process of forming a light-transmittance layer 160 for supporting the first substrate 100.

Additionally, the display apparatus according to the present disclosure further comprises a display driving circuit portion 200.

The display driving circuit portion 200 is connected to a pad portion provided on the non-display area NA of the first substrate 100 to display an image corresponding to image data supplied from a display driving system on each pixel. The display driving circuit portion 200 according to one embodiment includes a plurality of flexible circuit films 210, a plurality of data driving integrated circuits 220, a printed circuit board 230, and a timing controller 240.

Input terminals provided at one side of each of the plurality of flexible circuit films 210 are attached to the printed circuit board 230 by a film attachment process, and output terminals provided at the other side of each of the plurality of flexible circuit films 210 are attached to the pad portion provided on the first substrate 100 by a film attachment process.

Each of the plurality of data driving integrated circuits 220 is packaged in each of the plurality of flexible circuit films 210. Each of the plurality of data driving integrated circuits 220 receives pixel data and data control signal supplied form the timing controller 240, and converts the pixel data to analog type pixel data in accordance with the data control signal and then supplies the converted data to the data line.

The printed circuit board 230 serves to support the timing controller 220 and transfer signals and power sources between elements of the display driving circuit portion 200.

The timing controller 240 is packaged in the printed circuit board 230, and receives the image data and timing synchronization signal supplied form the display driving system through a user connector provided in the printed circuit board 230. The timing controller 240 generates pixel data by aligning the image data to be matched with a pixel arrangement structure of the pixel array layer 120 on the basis of the timing synchronization signal, and provides the generated pixel data to the corresponding data driving integrated circuit 220. Also, the timing controller 240 generates each of a data control signal and a scan control signal on the basis of the timing synchronization signal, controls a driving timing of each of the plurality of data driving integrated circuits 220 through the data control signal, and controls a driving timing of a scan driving circuit through the scan control signal. In this case, the scan control signal may be supplied to the corresponding scan driving circuit through the first and/or last flexible circuit films of the plurality of flexible circuit films 210.

Additionally, the display apparatus according to the present disclosure further comprises a light transmittance layer 160 attached to the first substrate 100 to overlap the first substrate 100.

The light transmittance layer 160 is attached to the second surface opposite to the first surface provided with the buffer layer 110 formed on the first substrate 100, by a transparent adhesive layer. The light transmittance layer 160 according to one embodiment may be made of a flexible film, for example, at least one of a polyethylene terephthalate film, anti-reflection film, a polarizing film and a transmittance controllable film. The light transmittance layer 160 may be attached to the second surface of the first substrate 100 separated from the carrier glass substrate. The transparent adhesive layer may be an optically clear resin (OCR) or an optically clear adhesive (OCA).

Figure 3:
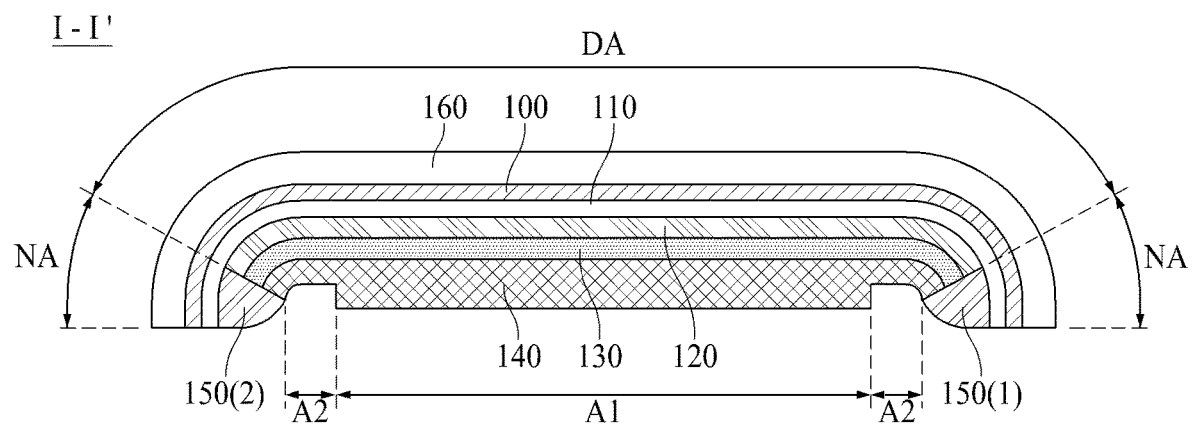
FIG. 3 is a cross-sectional view illustrating a bent state of a display apparatus shown in FIG. 2.

FIG. 3 is a cross-sectional view illustrating a bent state of a display apparatus shown in FIG. 2.

Referring to FIG. 3, the display apparatus 100 according to the present disclosure is bent to have a curved type. That is, an edge display area of the first substrate 100 is bent toward the second surface of the second surface 140 to have a certain curvature radius and thus surrounds the side of the second substrate 140. At this time, the edge display area of the first substrate 100 may be bent to have a curvature radius of 1 mm to 5 mms.

An edge display screen (or sub display screen) is provided at the edge of the display area DA bent in a curved type as above. On the other hand, a front display screen (or main display screen) which substantially has a plane state is provided in the display area DA which is not bent.

As described above, the display apparatus according to the present disclosure may facilitate bending because the second area A2 of the second substrate 140 is formed to be thinner than the first area A1. Also, a bezel width of 10 μm or less may be obtained in accordance with bending, and damage of the thin film transistor and/or the light emitting diode layer may be avoided during bending.

Figure 4:
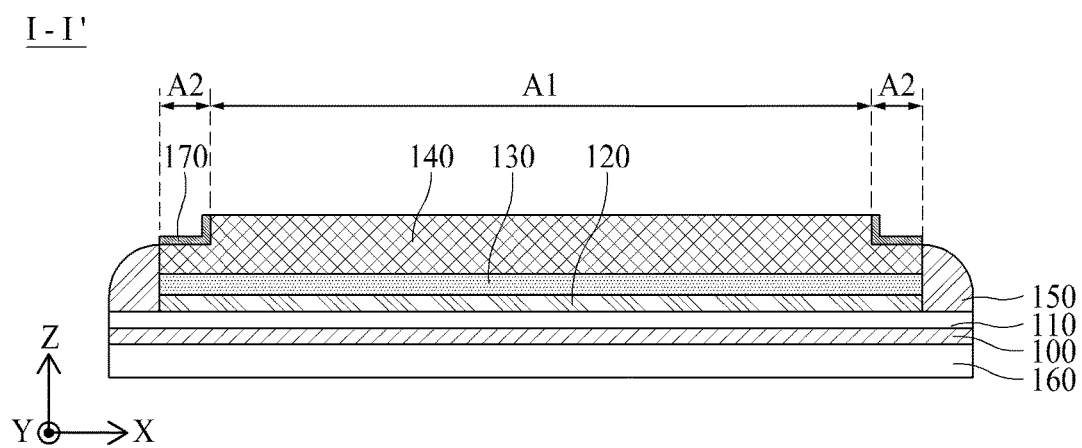
FIG. 4 is a cross-sectional view taken along line I-I' of FIG. 1, illustrating a display apparatus according to the second embodiment of the present disclosure.
Figure 5:
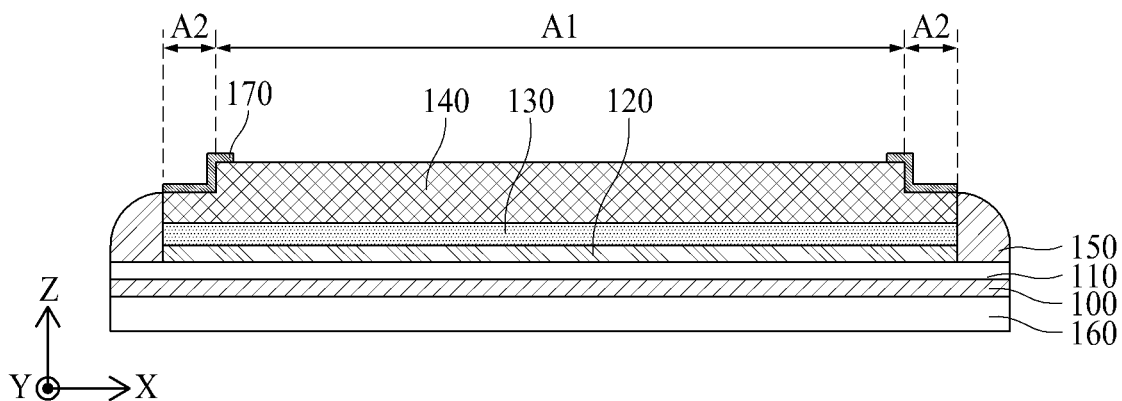
FIG. 5 is a cross-sectional view taken along line I-I' of FIG. 1, illustrating a display apparatus according to the third embodiment of the present disclosure.

FIG. 4 is a cross-sectional view taken along line I-I' of FIG. 1, illustrating a display apparatus according to the second embodiment of the present disclosure, and FIG. 5 is a cross-sectional view taken along line I-I' of FIG. 1, illustrating a display apparatus according to the third embodiment of the present disclosure.

Referring to FIGS. 4 and 5, the display apparatus according to the second and third embodiments of the present disclosure comprises a first substrate 100, a pixel array layer 120, a second substrate 140, a cover layer 150, and a passivation layer 170. Repeated description of the aforementioned description will be omitted, and the passivation layer 170 will be described.

The passivation layer 170 is provided on the second area A2 of the second substrate 140. The passivation layer 170 is formed to cover the second area A2 of the second substrate 140, thereby preventing the second substrate 140 from being oxidized. The passivation layer 150 may be formed by, but not limited to, atmospheric pressure plasma process and low temperature deposition process.

The second area A2 of the second substrate 140 according to one embodiment is the area partially etched by an etching process, and may be exposed to external water and oxygen. Since the second substrate 140 is made of a metal material, it may be vulnerable to corrosion, and if the surface of the second substrate 140 is removed by an etching process, the second substrate is easily exposed to external water and oxygen, whereby oxidization (rust) is generated. If oxidization (rust) is generated in the second substrate 140, a thickness of the surface is changed, and a rough surface may be generated by step difference caused by the thickness change.

The passivation layer 170 according to one embodiment may be provided on the second area A2 of the second substrate 140 to prevent oxidization of the etched portion. The passivation layer 170 may prevent corrosion of the second substrate 140 from occurring by blocking oxygen and/or water from being permeated into the second substrate 140. The passivation layer 170 may be made of a single layer or multiple layers. For example, the passivation layer 170 may be formed of any one of SiOx, SiNx, and SiON, or may be formed of multiple layers of one or more inorganic films deposited alternately.

The passivation layer 170 may be formed to have a thin thickness of 1 μm or less. Since the second area A2 of the second substrate 140 corresponds to the area of which thickness is reduced to facilitate bending, the passivation layer 170 is formed at a thin thickness to maintain the thin thickness of the second area. For example, since the second substrate 140 in the second area A2 may be formed at a thickness of 20 μm to 80 μm, the passivation layer 170 is formed at a thickness thinner than the second substrate 140. Therefore, the thickness of the second substrate 140 in the second area A2 and the thickness of the passivation layer 170 are thinner than the thickness of the second substrate 140 in the first area A1. In this way, since the passivation layer 170 is formed at a thin thickness, stress applied to the display panel may not be increased and at the same time oxidization of the second substrate 140 may be avoided.

Referring to FIG. 5 again, the passivation layer 170 according to one embodiment may be provided to cover the boundary between the first area A1 and the second area A2.

If the second substrate 140 is partially etched by an etching process, oxidization of the second substrate 140 may be generated even at the boundary portion between the first area A1 and the second area A2 as well as the second are A2. The passivation layer 170 may be formed at some area of the end of the first area A1 constituting the boundary with the second area A2 to fully cover the boundary portion between the first area A1 and the second area A2. In this way, the passivation layer 170 may be formed to fully cover the boundary portion between the first area A1 and the second area A2 to prevent oxidization from occurring at some area of the end of the first area A1 as well as the second area A2.

Figure 6:
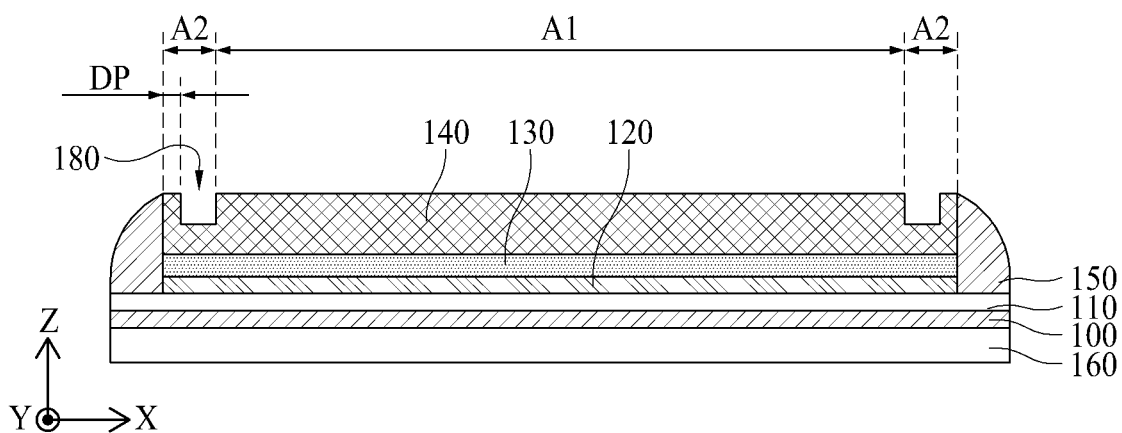
FIG. 6 is a cross-sectional view taken along line I-I' of FIG. 1, illustrating a display apparatus according to the fourth embodiment of the present disclosure.
Figure 7:
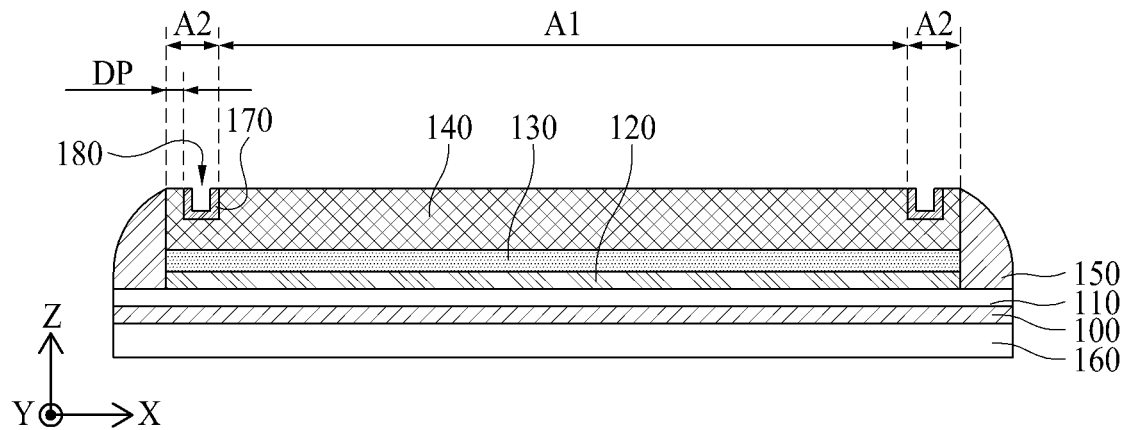
FIG. 7 is a cross-sectional view taken along line I-I' of FIG. 1, illustrating a display apparatus according to the fifth embodiment of the present disclosure.
Figure 8:
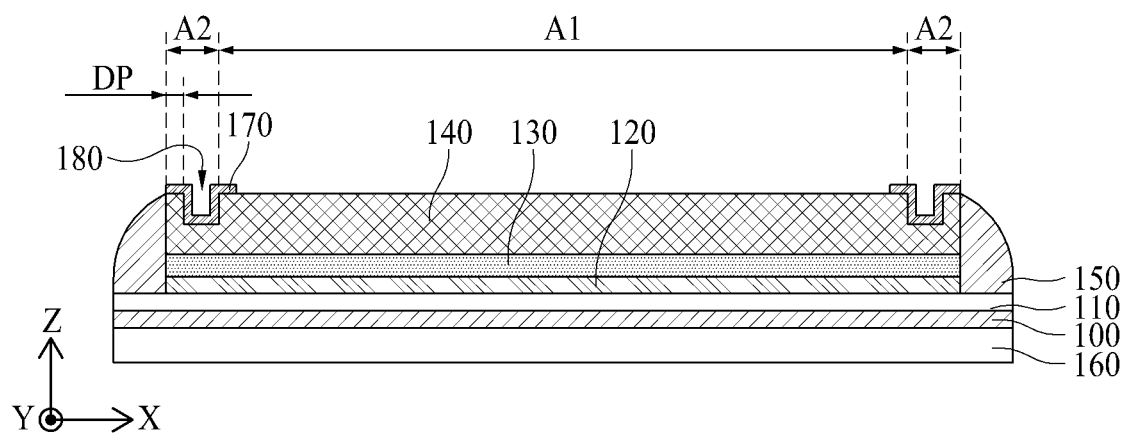
FIG. 8 is a cross-sectional view taken along line I-I' of FIG. 1, illustrating a display apparatus according to the sixth embodiment of the present disclosure.

FIG. 6 is a cross-sectional view taken along line I-I' of FIG. 1, illustrating a display apparatus according to the fourth embodiment of the present disclosure, FIG. 7 is a cross-sectional view taken along line I-I' of FIG. 1, illustrating a display apparatus according to the fifth embodiment of the present disclosure, and FIG. 8 is a cross-sectional view taken along line I-I' of FIG. 1, illustrating a display apparatus according to the sixth embodiment of the present disclosure.

Referring to FIGS. 6 to 8, the display apparatus according to the fourth to sixth embodiments of the present disclosure comprises a first substrate 100, a pixel array layer 120, a second substrate 140, a cover layer 150, a passivation layer 170, and a groove 180. Repeated description of the aforementioned description will be omitted, and the groove 180 will be described.

The groove 180 is provided in the second area A2 of the second substrate 140. The groove 180 is provided between the boundary of the first area A1 and the second area A2 and an end portion DP of the second substrate 140. The end portion DP may be defined at both ends of the second substrate 140, and may be a portion included in the second area A2.

The display apparatus according to one embodiment is provided in a structure that the second substrate 140 is not fully etched in the second area A2 and has the groove 180. Since the second area A2 corresponds to the area located at both ends of the second substrate 140, the side of the second substrate 140 may be etched together with the second substrate 140 during the process of etching the second substrate 140 in the second area A2. However, the display apparatus according to the present disclosure may be provided in a structure that the second substrate 140 of the other area except the end portion DP in the second area A2 is etched to form the groove 180.

In the display apparatus according to one embodiment, since the second substrate 140 of the end portion DP is not etched, the problem that the side of the second substrate 140 is etched may be solved. The end portion DP has a width smaller than that of the second area A2, and corresponds to the portion less affected by a stress than the center portion of the second area A2 during bending. Therefore, even though the second substrate 140 of the end portion DP is not etched, if the second substrate 140 in the second area A2 other than the end portion DP is etched, a stress generated during bending may be reduced.

The display apparatus according to one embodiment may further comprise the passivation layer 170 for covering the groove 180. In this case, the passivation layer 170 may be provided inside the groove 180, and may be provided to cover the boundary of the first area A1 and the second area A2 and the end portion DP. Since the passivation layer 170 has the same features as those of the aforementioned passivation layer, its repeated description will be omitted.

Figure 9:
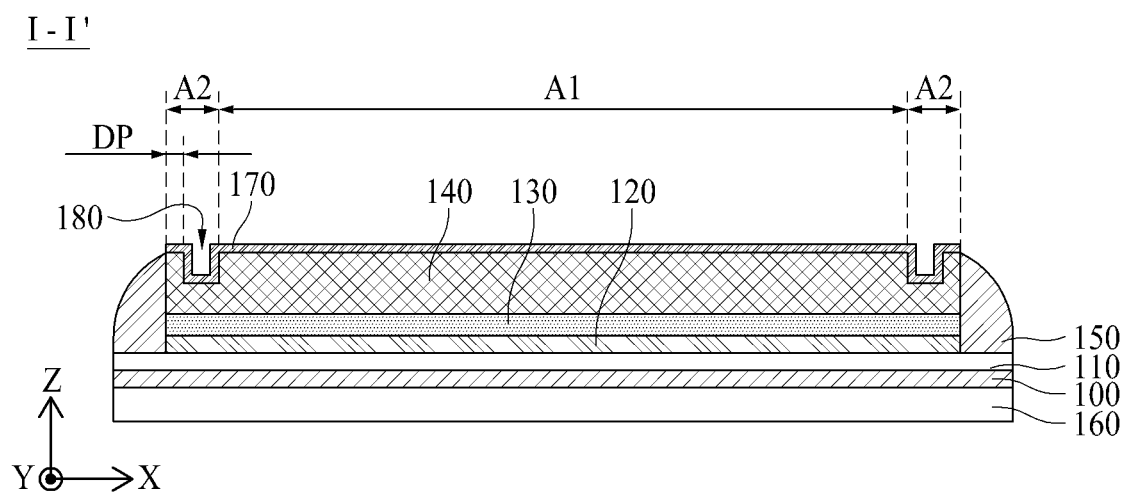
FIG. 9 is a cross-sectional view taken along line I-I' of FIG. 1, illustrating a display apparatus according to the seventh embodiment of the present disclosure.

FIG. 9 is a cross-sectional view taken along line I-I' of FIG. 1, illustrating a display apparatus according to the seventh embodiment of the present disclosure.

Referring to FIG. 9, the display apparatus according to the seventh embodiment of the present disclosure comprises a first substrate 100, a pixel array layer 120, a second substrate 140, a cover layer 150, a passivation layer 170, and a groove 180. Repeated description of the aforementioned description will be omitted, and description will be given based on a difference from the aforementioned embodiments.

The passivation layer 170 is provided to cover an entire surface of the second substrate 140. Since the second substrate 140 is made of a metal material, oxidization may be generated even in case of the portion which is not etched. In the display apparatus according to the present disclosure, since the passivation layer 170 is formed to cover the entire surface of the second substrate 140, oxidization, which may occur in the area that is not etched as well as the area that is partially etched, may be avoided. In this way, if the passivation layer 170 is provided on the entire surface of the second substrate 140, oxidization in all areas of the second substrate 140 may be avoided, whereby reliability may be obtained.

As described above, the display apparatus according to the present disclosure has advantages in that it is optimized for a stress to facilitate bending of the bending portion and the pixel array layer provided on the bending portion may be prevented from being damaged during bending.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. Thus, the above embodiments are to be considered in all respects as illustrative and not restrictive. The scope of the disclosure should be determined by reasonable interpretation of the appended claims and all change which comes within the equivalent scope of the disclosure are included in the scope of the disclosure.

What is claimed is:

1. A display apparatus comprising:
a first substrate having a display area and a non-display area;
a pixel array layer provided on the display area of the first substrate; and
a second substrate provided on the pixel array layer, having a first area and a second area, the first area and the second area disposed within a boundary of the pixel array layer,
wherein a second area thickness is thinner than a first area thickness, and
wherein portions of the first substrate and the pixel array corresponding to the second area of the second substrate are bent with the second area.

2. The display apparatus of claim 1, further comprising a passivation layer provided on the second area of the second substrate.

3. The display apparatus of claim 2, wherein the first area thickness is thicker than a sum of the second area thickness and a passivation layer thickness.

4. The display apparatus of claim 2, wherein the passivation layer thickness is thinner than the second area thickness.

5. The display apparatus of claim 2, wherein the passivation layer covers a boundary between the first area and the second area of the second substrate.

6. The display apparatus of claim 2, wherein the passivation layer is formed of a single layer or multiple layers of SiNx and SiOx.

7. The display apparatus of claim 1, wherein the second substrate is a metal foil, a metal sheet, or a metal plate.

8. The display apparatus of claim 1, wherein the second substrate includes a step difference formed in a boundary between the first area and the second area,
wherein the step difference has a range of 40 μm to 60 μm.

9. The display apparatus of claim 1, wherein the second substrate is attached to the pixel array layer by an adhesive layer.

10. The display apparatus of claim 9, wherein the adhesive layer includes a decompression adhesive or a barrier decompression adhesive having a moisture absorption function.

11. A display apparatus comprising:
a base layer;
a first cover layer covering a first end and a second cover layer covering a second end of the base layer;
a pixel array layer on top of the base layer, the pixel array layer extending between the first cover layer and the second cover layer;
a first substrate on top of the pixel array layer and within a boundary of the pixel array layer, the first substrate having a first portion adjacent to the first cover layer, a second portion connecting the first and a third portion, and the third portion adjacent to the second cover layer, the first and the third portions of the first substrate having a first thickness and the second portion having a second thickness; and a second substrate on a bottom of the pixel array layer, wherein the first thickness is different than the second thickness.

12. The display apparatus of claim 11, wherein the first thickness is thinner than the second thickness.

13. The display apparatus of claim 11, further comprising: the base layer having a first end portion and a second end portion, the first end portion having a curvature radius that includes the first portion of the first substrate and the second end portion having the curvature radius that includes the third portion of the first substrate.

14. The display apparatus of claim 13, wherein the curvature radius has a range of 1 mm to 5 mm.

15. The display apparatus of claim 13, further comprising: the second portion of the first substrate having no curvature radius.

16. The display apparatus of claim 11, further comprising: a vertical offset between the first portion and the second portion and a second vertical offset between the third portion and the second portion.

17. The display apparatus of claim 16, further comprising: a first passivation layer covering the vertical offset; and a second passivation layer covering the second vertical offset.

18. The display apparatus of claim 11, further comprising: a first passivation layer covering the first portion of the first substrate; and a second passivation layer covering the third portion of the first substrate.

* * * * *